United States Patent
Levillain (10) Patent No.: US 10,112,740 B2
(45) Date of Patent: Oct. 30, 2018

(54) TAMPER-EVIDENT MESH MATERIAL AND METHODS OF MANUFACTURE THEREFOR

(71) Applicant: JX Nippon ANCI, Inc., Kennesaw, GA (US)

(72) Inventor: Marc Levillain, Les Milles (FR)

(73) Assignee: JX NIPPON ANCI, INC., Kennesaw, GA (US)

( * ) Notice: Subject to any disclaimer, the term of this patent is extended or adjusted under 35 U.S.C. 154(b) by 0 days.

(21) Appl. No.: 15/494,471

(22) Filed: Apr. 22, 2017

(65) Prior Publication Data

US 2017/0305607 A1   Oct. 26, 2017

Related U.S. Application Data

(60) Provisional application No. 62/326,683, filed on Apr. 22, 2016.

(51) Int. Cl.
| | | |
|---|---|---|
| *B65D 33/14* | (2006.01) | |
| *B65D 33/00* | (2006.01) | |
| *D04H 1/4234* | (2012.01) | |
| *D04H 1/4374* | (2012.01) | |
| *D04H 1/559* | (2012.01) | |
| *D04H 1/74* | (2006.01) | |

(Continued)

(52) U.S. Cl.
CPC ........... *B65D 33/004* (2013.01); *B65D 29/02* (2013.01); *C23C 14/12* (2013.01); *C23C 14/185* (2013.01); *C23C 14/24* (2013.01); *C23C 14/34* (2013.01); *D04H 1/4234* (2013.01); *D04H 1/4374* (2013.01); *D04H 1/559* (2013.01); *D04H 1/74* (2013.01)

(58) Field of Classification Search
CPC ...... B65D 33/004; B65D 29/02; C23C 14/12; C23C 14/185; C23C 14/24; C23C 14/34; D04H 1/4234; D04H 1/4374; D04H 1/559; D04H 1/74
USPC ..................................................... 383/5, 117
See application file for complete search history.

(56) References Cited

U.S. PATENT DOCUMENTS

| | | | | | |
|---|---|---|---|---|---|
| 4,749,084 | A | * | 6/1988 | Pereyra ................. | B65D 75/30 206/459.1 |
| 5,190,812 | A | * | 3/1993 | Joseph ................. | D01D 5/0985 156/167 |

(Continued)

FOREIGN PATENT DOCUMENTS

| | | |
|---|---|---|
| WO | 2009/011853 A1 | 1/2009 |
| WO | 2012/035546 A2 | 3/2012 |

OTHER PUBLICATIONS

International Search Report and Written Opinion of the International Searching Authority, International Application No. PCT/US2017/029018, 10 pages, dated Jun. 26, 2017.

(Continued)

*Primary Examiner* — Jes F Pascua
(74) *Attorney, Agent, or Firm* — Thompson Hine LLP (57) ABSTRACT

The present invention is directed to tamper-evident mesh material, methods of manufacture therefor, and tamper-evident bags manufactured therefrom. The tamper-evident mesh material of the present invention may be used, for example, in the manufacture of a variety of tamper-evident security bags for use in applications where it is desirable to detect any traces or evidence of tampering with or of unauthorized access to the contents of the bag.

22 Claims, 10 Drawing Sheets

(51) Int. Cl.
    *B65D 30/08*     (2006.01)
    *C23C 14/18*     (2006.01)
    *C23C 14/12*     (2006.01)
    *C23C 14/24*     (2006.01)
    *C23C 14/34*     (2006.01)

(56) References Cited

U.S. PATENT DOCUMENTS

| | | | |
|---|---|---|---|
| 5,316,838 A * | 5/1994 | Crandall | D04H 1/559 |
| | | | 359/515 |
| 2011/0085749 A1 | 4/2011 | Frei et al. | |
| 2012/0322638 A1* | 12/2012 | Seber | B65D 75/22 |
| | | | 493/110 |
| 2013/0137805 A1* | 5/2013 | Salomons | C09D 167/00 |
| | | | 524/220 |

OTHER PUBLICATIONS

International Search Report and Written Opinion of the International Searching Authority, International Application No. PCT/US2017/057026, 10 pages, dated Dec. 22, 2017.

* cited by examiner

TAMPER-EVIDENT MESH MATERIAL AND METHODS OF MANUFACTURE THEREFOR

PRIORITY CLAIM

To the fullest extent permitted by law, the present non-provisional patent application claims priority to, and the full benefit of, U.S. Provisional Patent Application No. 62/326,683, filed on Apr. 22, 2016, and entitled "Tamper-Evident Mesh Material and Methods of Manufacture Therefor".

FIELD OF THE INVENTION

The present invention relates generally to tamper-evident material and, more specifically, to tamper-evident mesh material, methods of manufacture therefor, and tamper-evident bags manufactured therefrom.

BACKGROUND OF THE INVENTION

Tamper-evident security bags manufactured from woven or nonwoven fabrics are known. Such security bags, however, suffer a shortcoming in that the strands of the woven or nonwoven fabric may be displaced, without detection, and thereby allow the unauthorized access to the contents of the bag.

Therefore, a need exists for a tamper-evident mesh material for use in the manufacture of tamper-evident security bags, in which the displacement of any strands of the mesh material can be detected, the presence of which indicates that the bag and the contents thereof had been tampered with or otherwise accessed without authorization.

SUMMARY OF THE INVENTION

The present invention is directed to tamper-evident mesh material, methods of manufacture therefor, and tamper-evident bags manufactured therefrom. The tamper-evident mesh material of the present invention may be used, for example, in the manufacture of a variety of tamper-evident security bags for use in applications where it is desirable to detect any traces or evidence of tampering with, or of unauthorized access to, the contents of the bag. Examples of such tamper-evident security bags include currency bags or transaction bags.

The tamper-evident mesh material of the present invention is formed from a pigmented nonwoven mesh fabric comprising a contrast layer disposed thereover. The nonwoven mesh fabric comprises a first plurality of strands and a second plurality of strands, wherein the first plurality of strands is oriented in a direction different from the second plurality of strands, and the first plurality of strands is disposed over and bonded to the second plurality of strands at a plurality of crossover points, i.e., points where overlying strands of the first plurality of strands cross over and contact underlying strands of the second plurality of strands. Each strand of the first and second plurality of strands is pigmented. At least one surface of each strand of the first and second plurality of strands is covered with a contrast layer that is visually distinct from the pigmentation of each of the strands. The contrast layer may be, for example, a metal layer, a printed layer or a coating. Specifically, the contrast layer may be disposed over, for example, the front surface of each strand of the first and second plurality of strands to conceal the pigmentation of those front surfaces; however, sections on the front surface of the underlying strands of the second plurality of strands over which the overlying strands of the first plurality of strands are bonded (namely, at the plurality of crossover points) do not include the contrast layer, as those sections were shielded during application of the contrast layer by sections of the overlying strands of the first plurality of strands bonded thereover. Breakage of the bond, and thus disruption of the contrast layer, at a crossover point of an overlying strand and an underlying strand of the respective first and second plurality of strands (via displacement of either the overlying or underlying strand) exposes the pigmented section of the underlying strand at that particular crossover point, i.e., the pigmented section on the front surface of the underlying strand to which the overlying strand had been previously bonded. In a tamper-evident security bag formed from the tamper-evident mesh material of the present invention, the visibility of that pigmented section on that underlying strand would serve as an indicator that the bag and the contents thereof had been tampered with or otherwise accessed without authorization.

In one embodiment of the present invention, the tamper-evident mesh material is formed from a metalized, pigmented nonwoven mesh fabric. The nonwoven mesh fabric comprises a first plurality of strands and a second plurality of strands, wherein each strand of the first and second plurality of strands is pigmented, and wherein the first plurality of strands is oriented in a direction different from the second plurality of strands. The first plurality of strands is disposed over and thermally bonded to the second plurality of strands at a plurality of crossover points, i.e., where the first plurality of strands crosses over and contacts the second plurality of strands. At least one surface of each strand of the first and second plurality of strands is metalized. Specifically, a metal layer is disposed over, for example, the front surface of each strand of the first and second plurality of strands to conceal the pigmentation of those front surfaces; however, sections on the front surface of the strands of the second plurality of strands over which the strands of the first plurality of strands are thermally bonded (namely, at the plurality of crossover points) are not metalized, as those sections on the front surface of those strands of the second plurality of strands were shielded during the metallization process by sections of strands of the first plurality of strands thermally bonded thereover. Breakage of the thermal bond, and thus disruption of the metal layer, at a crossover point of an overlying strand and an underlying strand, respectively, of the first and second plurality of strands (via displacement of either the overlying or underlying strand) exposes the pigmented, non-metalized section of the underlying strand at that particular crossover point, i.e., the pigmented section on the front surface of that underlying strand over which the overlying strand had been previously thermally bonded. In a tamper-evident security bag formed from the tamper-evident mesh material of the present invention, the visibility of that pigmented, non-metalized section on that underlying strand would serve as an indicator that the bag and the contents thereof had been tampered with or otherwise accessed without authorization.

In another embodiment of the present invention, in which the tamper-evident mesh material is formed from a metalized, pigmented nonwoven mesh fabric, the nonwoven mesh fabric thereof comprises a plurality of pigmented strands oriented in a first direction (first direction (or FD) strands) disposed over a plurality of pigmented strands oriented in a second direction (second direction (or SD) strands). The FD strands are thermally bonded to the SD strands at a plurality of crossover points, i.e., where the FD strands cross over and contact the underlying SD strands.

The front surface of the nonwoven mesh fabric is metalized to conceal the pigmentation of the nonwoven mesh fabric, and, more precisely, to conceal the pigmentation of the front surfaces of the FD and SD strands thereof. Specifically, a metal layer extends over the entire front surface of each FD strand, and over the front surface of each SD strand except for those sections on the front surface of each SD strand over which the FD strands are thermally bonded (namely, at the plurality of crossover points). Breakage of the thermal bond, and thus disruption of the metal layer, at a crossover point of the metalized FD and SD strands (via displacement of those metalized FD or SD strands) exposes the pigmented, non-metalized section of the SD strand at that particular crossover point, i.e., the pigmented section on the front surface of the SD strand over which the FD strand had been previously thermally bonded. In a tamper-evident security bag formed from the afore-described tamper-evident mesh material, the visibility of this pigmented, non-metalized section of the SD strand would serve as an indicator that the bag and the contents thereof had been tampered with or otherwise accessed without authorization.

The tamper-evident mesh material of the present invention may be used in the manufacture of a tamper-evident security bag, pouch or other packaging, including a bag having one side formed from film and the other side formed from the tamper-evident mesh material of the present invention, or a bag having film sides with one or more windows formed from the tamper-evident mesh material of the present invention, or a bag in which both sides are formed from the tamper-evident mesh material of the present invention.

These and other features and advantages of the present invention will become apparent to those of ordinary skill in the art after reading the following Detailed Description of the Invention.

BRIEF DESCRIPTION OF THE DRAWINGS

The accompanying drawings, which are incorporated in and constitute a part of this specification, illustrate various embodiments of the present invention and, together with the general description of the invention given above, and the detailed description of the embodiments given below, serve to explain the embodiments of the invention.

DETAILED DESCRIPTION OF THE INVENTION

For simplicity and illustrative purposes, the principles of the present invention are described by referring to various exemplary embodiments thereof, and which embodiments may be depicted in FIGS. 1-10. The present invention is not limited to the particular examples, embodiments or methods described herein or otherwise depicted in the Figures, as these may vary. Additionally, the terminology used herein is used for the purpose of describing particular embodiments only, and is not intended to limit the scope of the present invention. Unless defined otherwise, all technical and scientific terms used herein have the same meanings as commonly understood by one of ordinary skill in the art to which this invention belongs. Specific methods and materials are described, although other methods and materials similar or equivalent to those described herein may be used in the practice of the present invention. Moreover, although certain methods may be described with reference to certain steps that are presented herein in a certain order, in many instances, these steps may be performed in any order as would be appreciated by one of ordinary skill in the art, and thus the methods are not limited to the particular arrangement of steps disclosed herein.

Referring now to FIGS. 1-5, in one embodiment of the present invention, tamper-evident mesh material 10 is formed from a metalized, pigmented nonwoven mesh fabric 20. Mesh fabric 20 comprises a plurality of pigmented strands oriented in a first direction (first direction (or FD) strands 22) disposed over a plurality of pigmented strands oriented in a second direction (second direction (or SD) strands 24). FD strands 22 may be, for example, a plurality of pigmented strands generally oriented in the cross machine direction (cross machine direction (or CD) strands), and SD strands 24 may be, for example, a plurality of pigmented strands generally oriented in the machine direction (machine direction (or MD) strands), or vice versa. FD strands 22 are thermally bonded (e.g., via calendaring, through-air, infrared or ultrasonic) (or, alternatively, chemically bonded (e.g., via solvents or binders)) to SD strands 24 at substantially each of crossover points 23, i.e., at substantially each point where the FD strands 22 cross over and contact the underlying SD strands 24. (As used herein, the term "substantially", when made with reference to thermal bonding at "each of crossover points 23", is intended to allow for conventional levels of bonding imperfections and defects in otherwise uniformly oriented and bonded nonwoven fabrics.).

Figure 1:
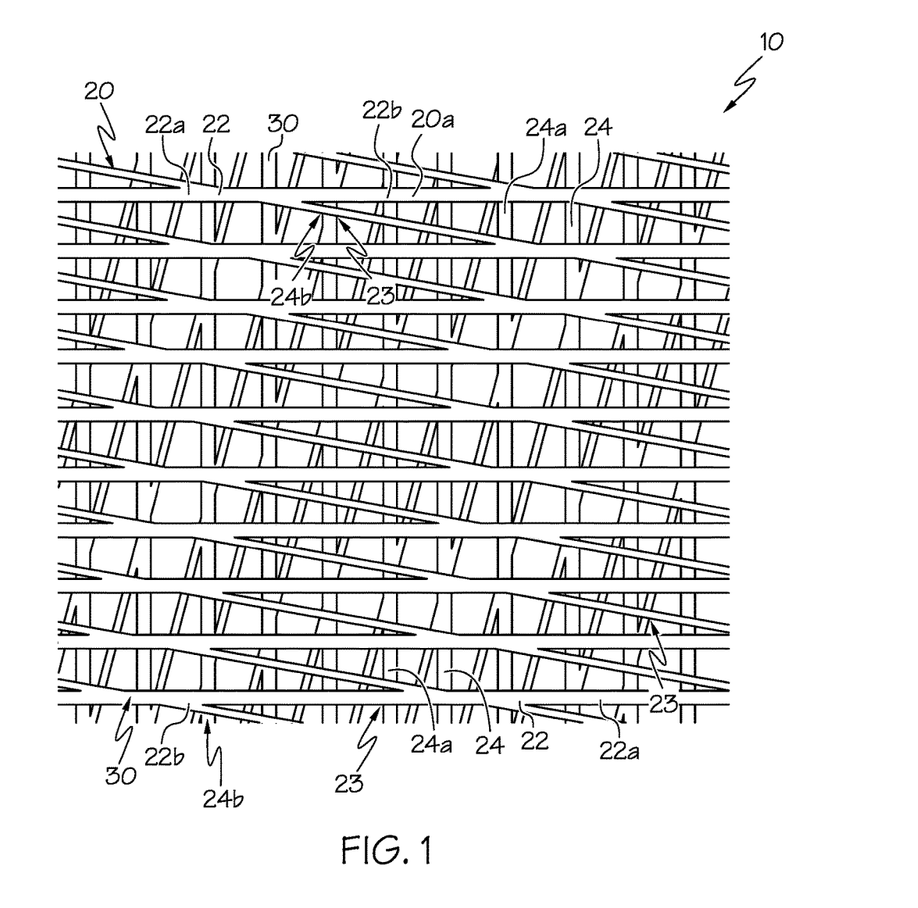
FIG. 1 is a plan view of a tamper-evident mesh material according to an embodiment of the present invention, showing no displacement of the FD and SD strands thereof.
Figure 2:
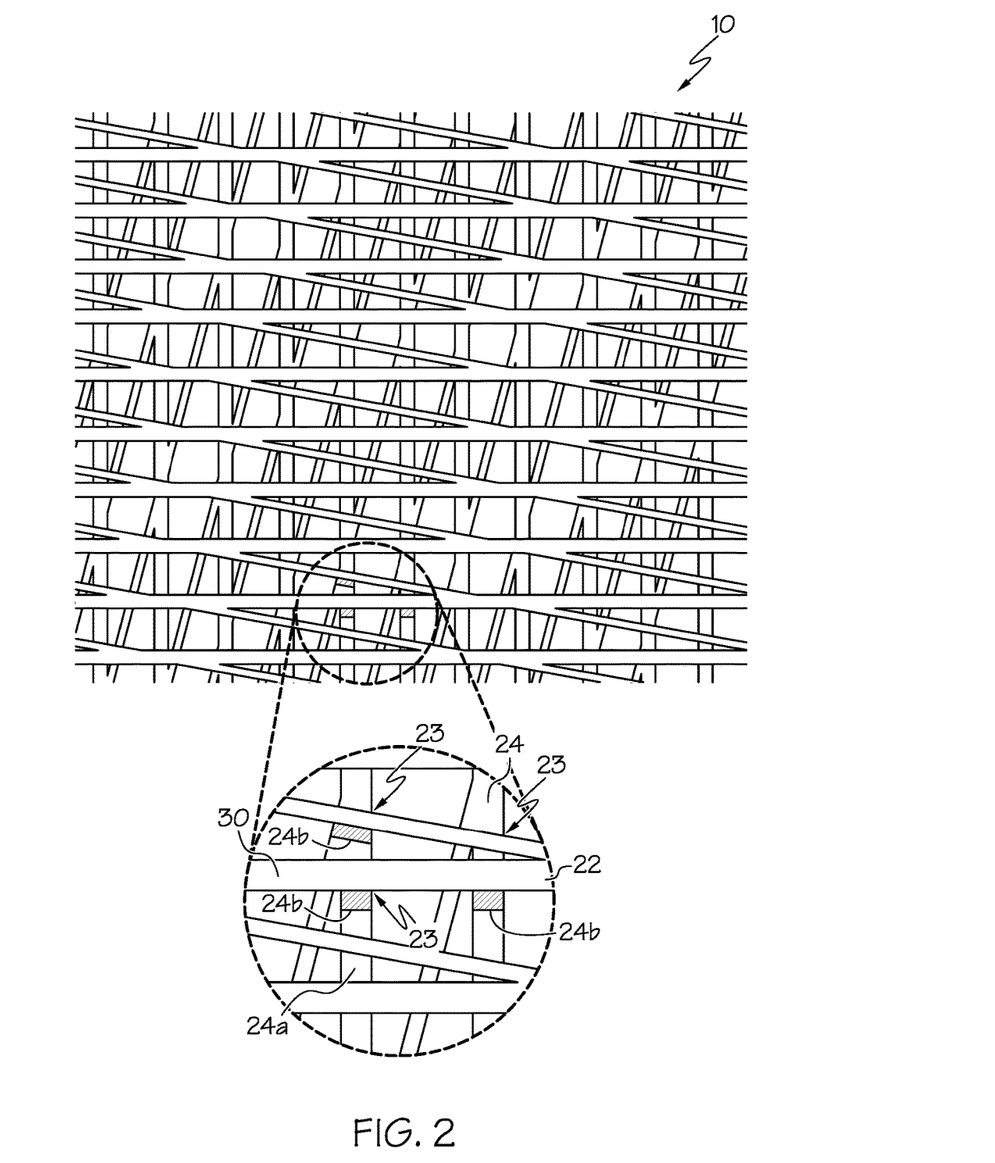
FIG. 2 is a plan view of the tamper-evident mesh material of FIG. 1, showing a magnified view of the displacement of certain of the FD and SD strands thereof.
Figure 3:
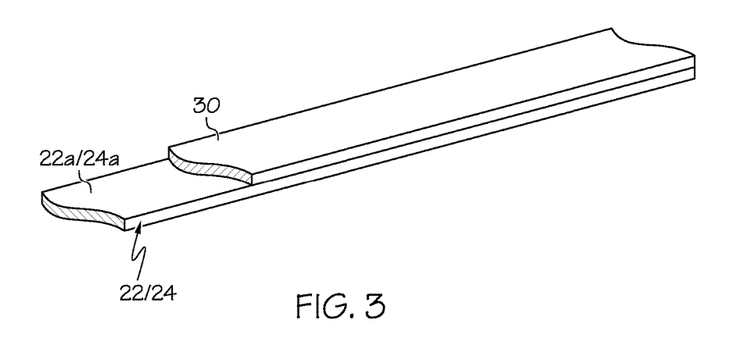
FIG. 3 is a cross-sectional perspective view of a portion of either a FD or SD strand of the tamper-evident mesh material of FIG. 1.
Figure 4:
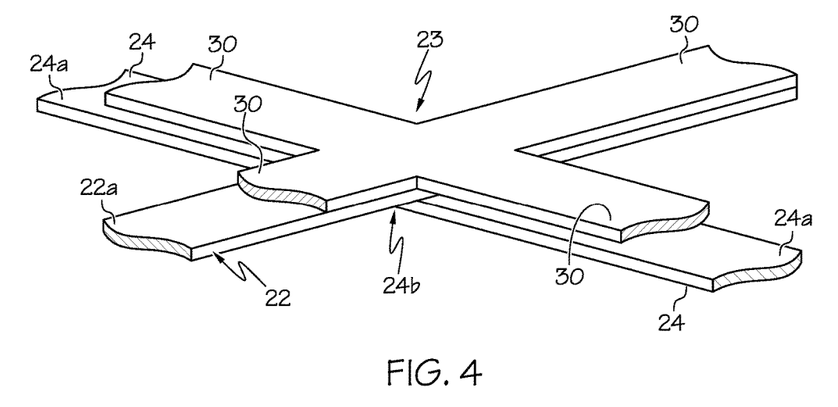
FIG. 4 is a cross-sectional perspective view of portions of FD and SD strands of the tamper-evident mesh material of FIG. 1, showing no displacement of the FD and SD strands.
Figure 5:
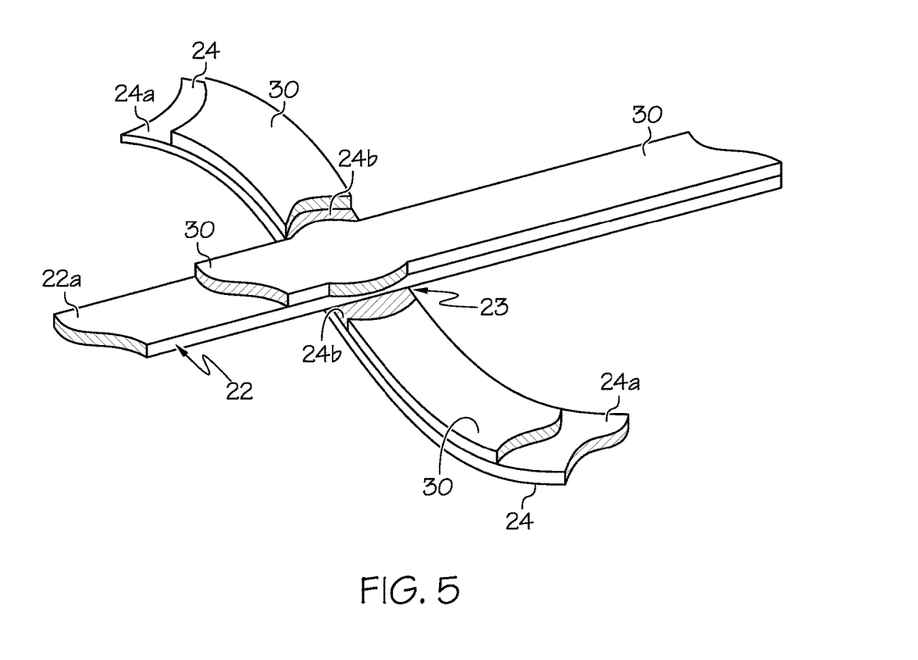
FIG. 5 is a cross-sectional perspective view of the portions of FD and SD strands of the tamper-evident mesh material of FIG. 4, showing displacement of the FD and SD strands.
Figure 6:
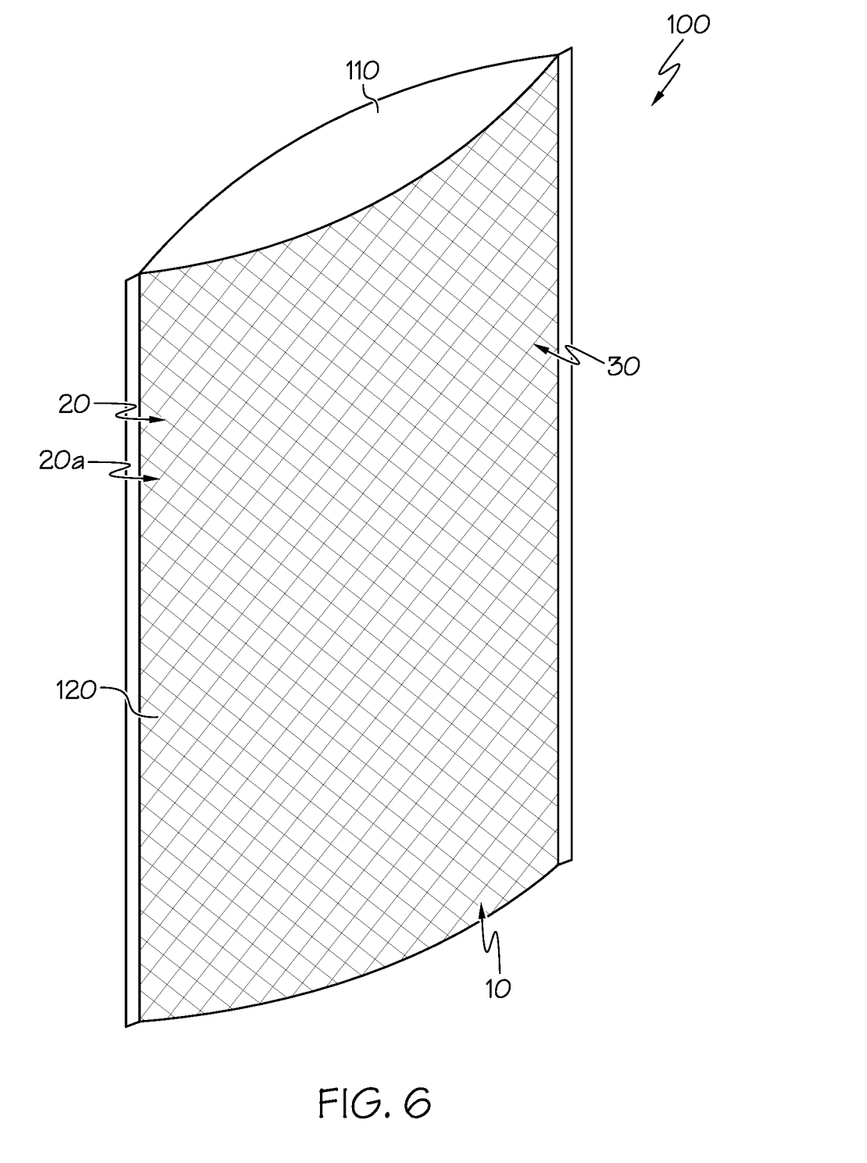
FIG. 6 is a perspective view of a tamper-evident security bag manufactured from the tamper-evident mesh material of FIG. 1.
Figure 7:
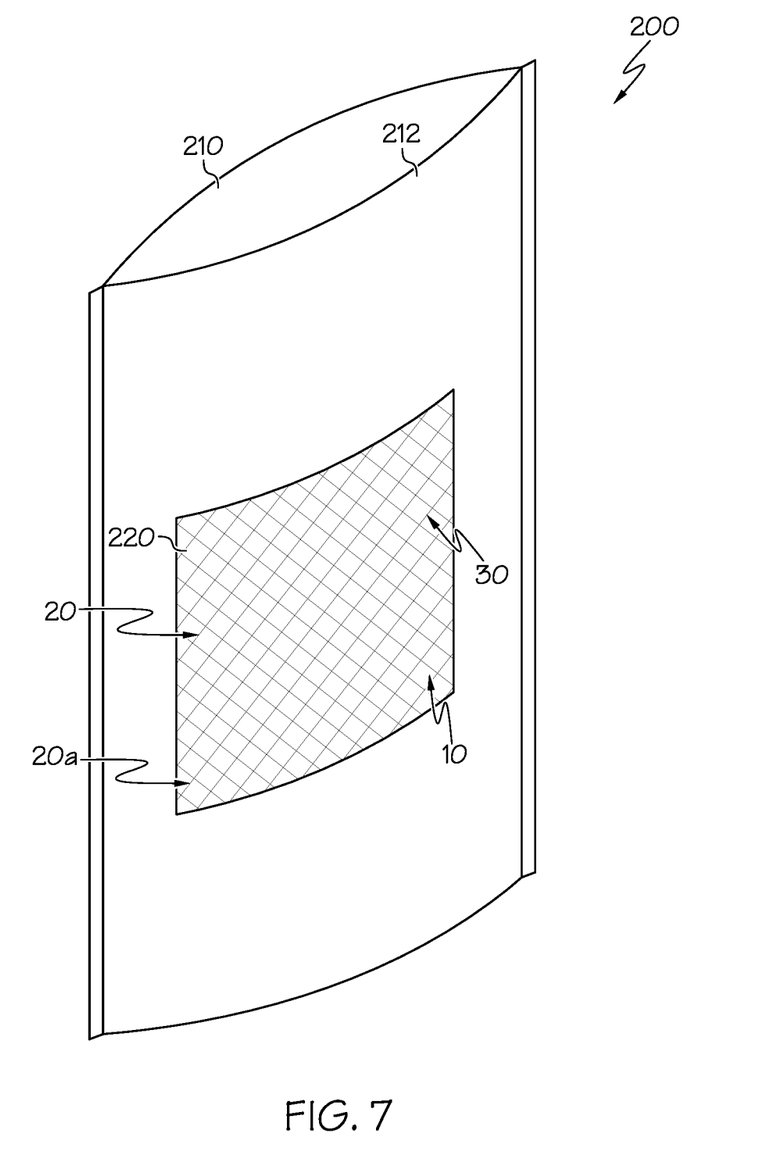
FIG. 7 is a perspective view of a tamper-evident security bag manufactured from the tamper-evident mesh material of FIG. 1.

A metal layer 30, applied via a metallization process (described below), is disposed over at least the front surface 20a of mesh fabric 20; that is, at least front surface 20a of mesh fabric 20 is metalized to conceal the pigmentation of mesh fabric 20, and, more precisely, to conceal the pigmentation of the front surfaces 22a, 24a, respectively, of FD and SD strands 22, 24 (see, FIGS. 1, 3, 4). Specifically, metal layer 30 extends over the entire front surface 22a of each FD strand 22, and over the front surface 24a of each SD strand 24 except for sections 24b on the front surface 24a of each SD strand 24 over which FD strands 22 are thermally bonded (namely, at substantially each of crossover points 23) (see, FIGS. 3, 4). Stated differently, the front surface 22a of each FD strand 22 is metalized, and the front surface 24a of each SD strand 24 is also metalized; however, the sections 24b on the front surface 24a of each SD strand 24 over which FD strands 22 are thermally bonded (namely, at substantially each of crossover points 23) are not metalized, as those sections 24b were shielded during the metallization process by the sections 22b of FD strands 22 thermally bonded thereover (see, FIGS. 1, 4). Consequently, breakage of the thermal bond, and thus disruption of metal layer 30, at a crossover point 23 of the metalized FD and SD strands 22, 24 (via displacement of those metalized FD or SD strands 22, 24) exposes the pigmented, non-metalized section 24b of the SD strand 24 at that particular crossover point 23, i.e., the pigmented section 24b on the front surface 24a of the SD strand 24 over which the FD strand 22 had been previously thermally bonded (see, FIGS. 2, 5). In a tamper-evident security bag formed from the afore-described tamper-evident mesh material, where the metalized front surface 20a of mesh fabric 20 forms, at least in part, an exterior face of the security bag, the visibility of this pigmented, non-metalized section 24b of SD strand 24 would serve as an indicator that the bag and the contents thereof had been tampered with or otherwise accessed without authorization.

Mesh fabric 20 may be formed from any colored or pigmented polyolefin (including, without limitation, polyethylene) or other suitable polymers, and more preferably from a cross-laminated nonwoven pigmented polyolefin fabric, including, without limitation, any such nonwoven pigmented fabric designated under the trademark CLAF® and available from JX Nippon ANCI, Inc. (including, without limitation, JX28 or other pigmented CLAF® fabrics (see, www.claf.com/english/claf/properties/pdf/claf_grade.pdf)). Red-pigmented JX28 fabric comprises FD strands (more specifically, CD strands) that are about 350 microns wide, and SD strands (more specifically, MD strands) that are about 907 microns wide. As such, if material 10 were formed from a metallized, red-pigmented JX28 fabric, displacing a CD or MD strand thereof, and breaking the thermal bond at a crossover point of the CD and MD strands, would reveal a red-pigmented, non-metalized section of the MD strand measuring about 350 microns by about 907 microns at that particular crossover point.

Metallization of mesh fabric 20 may be achieved through a variety of metallization techniques and processes, including for example: (a) vacuum metallization (the process of evaporating a metal, such as aluminum or other selected metals, in a vacuum chamber, which evaporated metal then bonds to the desired substrate (here, mesh fabric 20), applying a uniform metalized layer thereover (mesh fabric 20 would be unwound and rewound within the chamber during application of metal layer 30 via the metallization process)), with such vacuum metallization processes available through Printpack, Inc. (www.printpack.com) and Polyplex Corporation Limited (www.polyplex.com); and, (b) sputter-coating technologies, such as those available through Eastman Chemical Company (www.eastman.com) and Vacuum Depositing Inc. (www.vdi-llc.com), which may be used to apply an array of metals to the substrate (here, mesh fabric 20), including stainless steel, titanium, aluminum, gold, copper, silver, and other metal or metal oxide alloys. Additionally, slit die coating, foam coating, or gravure printing, may be used to apply metallic or non-metallic coatings to mesh fabric 20, such that each section 24b of each SD strand 24 (over which FD strands 22 are thermally bonded) remains uncoated or unprinted.

Figure 8:
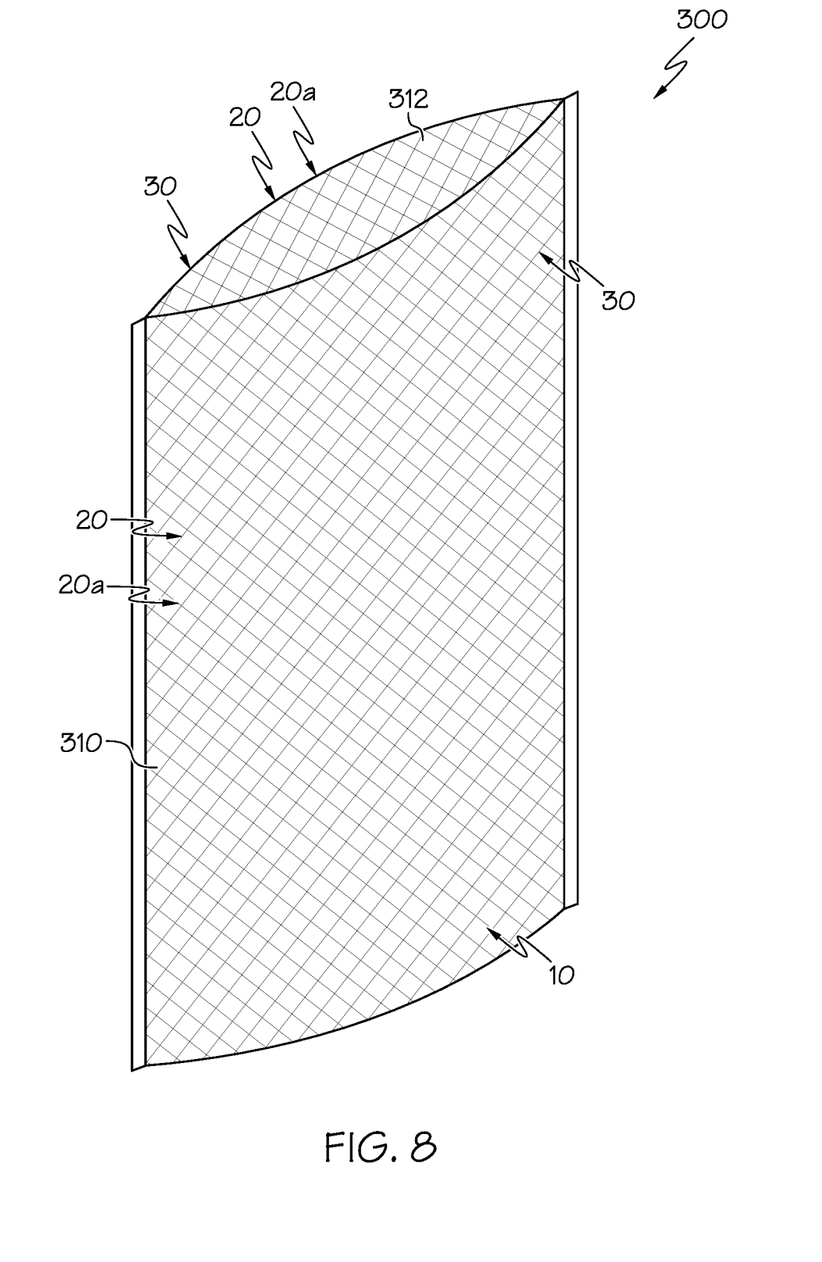
FIG. 8 is a perspective view of a tamper-evident security bag manufactured from the tamper-evident mesh material of FIG. 1.

Referring now to FIGS. 2, 5 and 6-8, the tamper-evident mesh material of the present invention may used in the manufacture of a tamper-evident security bag, pouch or other packaging, including a bag 100 having one side 110 formed from film and the other side 120 formed from the tamper-evident mesh material 10 of the present invention (see, FIG. 6), or a bag 200 having film sides 210, 212 with one or more windows 220 formed from the tamper-evident mesh material 10 of the present invention (see, FIG. 7), or a bag 300 having both sides 310, 312 formed from the tamper-evident mesh material of the present invention (see, FIG. 8). In each of bags 100, 200, 300, the metalized front surface 20a of mesh fabric 20 forms, at least in part, an exterior face of the bag. Breakage of the thermal bond, and thus disruption of metal layer 30, at a crossover point 23 of an overlying FD strand 22 and an underlying SD strand 24 of mesh fabric 20 (via displacement of those FD and SD strands 22, 24) exposes the pigmented, non-metalized section 24b of the underlying SD strand 24 at that particular crossover point 23, i.e., the pigmented section 24b on the front surface 24a of the underlying SD strand 24 over which the overlying FD strand 22 had been previously thermally bonded (see, FIGS. 2, 5). Visibility of this pigmented, non-metalized section 24b of the underlying SD strand 24 would serve as an indicator that the bag (100, 200, or 300) and the contents thereof had been tampered with or otherwise accessed without authorization. Bags 100, 200, 300 may be manufactured in accordance with any generally known and accepted bag manufacturing methods and practices, including, for example, side-sealed bag and tube bag manufacturing methods and practices. Tamper-evident tapes seals or other sealing strips may be incorporated into the mouth or opening of each such tamper-evident security bag, pouch or other packaging, including bags 100, 200, 300, also in accordance with generally known and accepted manufacturing methods and practices. Ink or dye packs may be used in conjunction with a tamper-evident security bag manufactured from material 10, with such inks or dyes having the ability to pass through material 10 upon tampering with or unauthorized access to the bag or the contents thereof.

Figure 9:
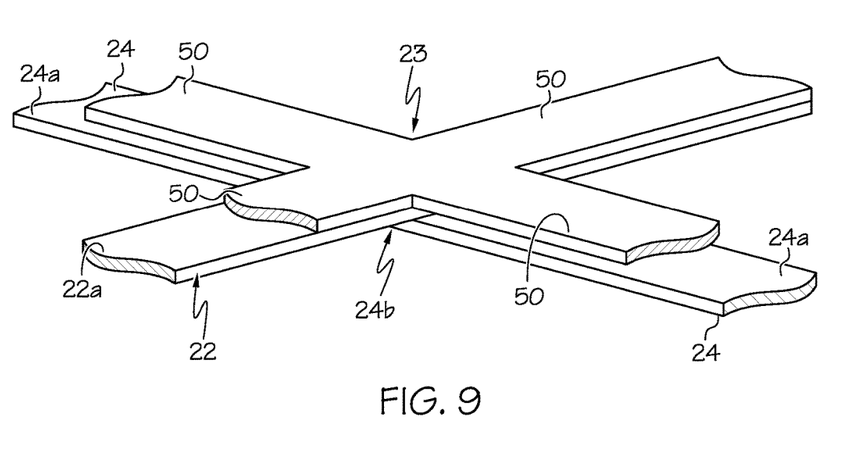
FIG. 9 is a cross-sectional perspective view of portions of FD and SD strands of a tamper-evident mesh material according to an embodiment of the present invention, showing no displacement of the FD and SD strands.
Figure 10:
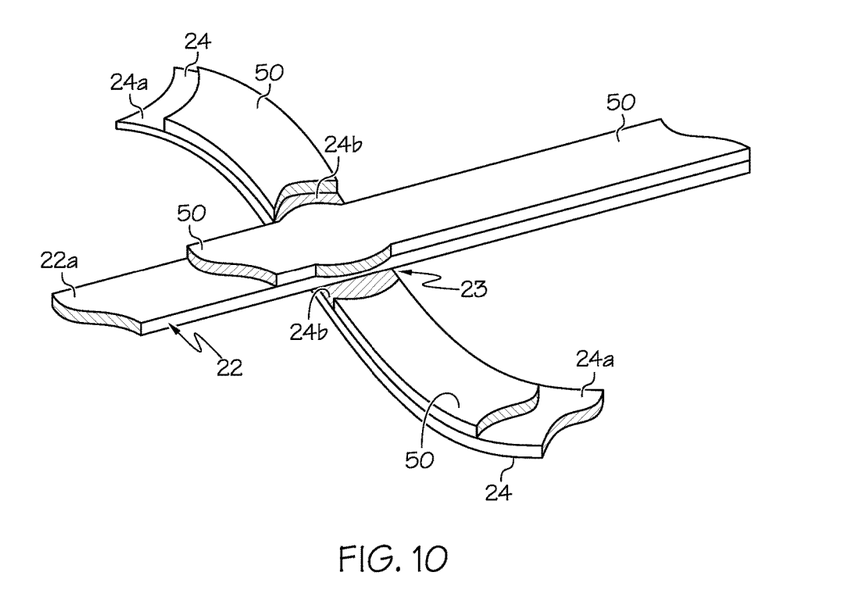
FIG. 10 is a cross-sectional perspective view of the portions of FD and SD strands of the tamper-evident mesh material of FIG. 9, showing displacement of the FD and SD strands.

Referring now to FIGS. 9 and 10, in a further embodiment of the present invention, tamper-evident mesh material 10 may comprise a printed layer or coating applied over front surface 20a of pigmented mesh fabric 20, instead of metal layer 30. The printed layer or coating (print/coating 50) may be an acrylic or urethane ink or coating, or other ink or coating suited for the application contemplated herein. Similar to the "metalized" embodiment described hereinabove, in this print/coating embodiment, pigmented nonwoven mesh fabric 20 comprises FD strands 22 disposed over and thermally bonded to SD strands 24 at substantially each of crossover points 23, i.e., at substantially each point where the FD strands 24 cross over and contact the underlying SD strands 24. Here as well, FD strands 22 may be, for example, a plurality of pigmented strands generally oriented in the cross machine direction (cross machine direction (or CD) strands), and SD strands 24 may be, for example, a plurality of pigmented strands generally oriented in the machine direction (machine direction (or MID) strands), or vice versa. A print/coating layer 50 is disposed over front surface 20a of mesh fabric 20 to conceal the pigmentation thereof, and, more precisely, to conceal the pigmentation of front surfaces 22a, 24a, respectively, of FD and SD strands 22, 24. Specifically, the print/coating layer 50 extends over the entire front surface 22a of each FD strand 22, and over front surface 24a of each SD strand 24 except for those sections 24b on the front surface 24a of each SD strand 24 over which FD strands 22 are thermally bonded (namely, at substantially each of crossover points 23). Stated differently, front surface 22a of each FD strand 22 includes the print/coating layer 50, and front surface 24a of each SD strand 24 also includes the print/coating layer 50; however, the sections 24b on the front surface 24a of each SD strand 24 over which FD strands 22 are thermally bonded do not include the print/coating layer 50, as those sections 24b were shielded during the printing/coating process by sections 22b of FD strands 22 thermally bonded thereover. Consequently, breakage of the thermal bond, and thus disruption of the print/coating layer 50, at a crossover point 23 of the FD and SD strands 22, 24 (via displacement of those FD or SD strands 22, 24) exposes the pigmented, unprinted/uncoated section 24b of the SD strand 24 at that particular crossover point 23, i.e., the pigmented section 24b on the front surface 24a of the SD strand 24 over which the FD strand 22 had been previously thermally bonded. In a tamper-evident security bag formed from the tamper-evident mesh material of this "print/coating" embodiment, where the print/coating layer 50 of the front surface 20a of the mesh fabric 20 forms, at least in part, an exterior face of the security bag, the visibility of this pigmented, unprinted/uncoated section 24b of the SD strand 24 would serve as an indicator that the bag and the contents thereof had been tampered with or otherwise accessed without authorization.

In yet a further embodiment of the present invention, the tamper-evident mesh material of the present invention is formed from a metalized, pigmented nonwoven mesh fabric, wherein the nonwoven mesh fabric comprises three or more pluralities of strands, each such plurality of strands oriented in a direction different from the other plurality(ies) of strands, with a first such plurality of strands thermally bonded over a second such plurality of strands at a plurality of crossover points (and with any such further plurality(ies) of strands thermally bonded, in succession, thereunder). Each of the strands of each plurality of strands are metalized. Specifically, through a metallization process, a metal layer is disposed over, for example, the front surface of each strand in each plurality of strands to conceal the pigmentation of those front surfaces; however, sections on the front surfaces of those strands over which other strands are thermally bonded (namely, at the plurality of crossover points) are not metalized, as those sections on the front surfaces of those strands were shielded during the metallization process by sections of the other strands thermally bonded thereover. Breakage of the thermal bond, and thus disruption of the metal layer, at a crossover point of an overlying and an underlying metalized strand (via displacement of those metalized strands) exposes the pigmented, non-metalized section of the underlying strand at that particular crossover point, i.e., the pigmented section on the front surface of the underlying strand over which the overlying strand had been previously thermally bonded. In a tamper-evident security bag formed from the tamper-evident mesh material of this further embodiment, the visibility of that pigmented, non-metalized section on that strand would serve as an indicator that the bag and the contents thereof had been tampered with or otherwise accessed without authorization. It is contemplated that, in this further embodiment, a print/coated layer may be used instead of the metal layer.

It is contemplated herein that both the front and back surfaces of mesh fabric 20, and thus the front and back surfaces of FD and SD strands 22, 24, may comprise the metal layer, print layer or coating described hereinabove, thus concealing the pigmentation of all surfaces of mesh fabric 20 with the exception of those surface sections of FD and SD strands 22, 24 thermally bonded to each other at substantially each of the crossover points 23 thereof. Accordingly, breakage of the thermal bond (and thus disruption of the metal layer, print layer or coating, as applicable) at a crossover point 23 of the FD and SD strands 22, 24, would expose the pigmented (non-metalized, unprinted, or uncoated, as applicable) surface sections of each of FD and SD strands 22, 24 at that particular crossover point 23, i.e., the pigmented sections on the back and the front surfaces, respectively, of FD and SD strands 22, 24, where FD and SD strands 22, 24 had been previously thermally bonded to each other. In a tamper-evident security bag formed from such a tamper-evident mesh material, the visibility of this pigmented section of SD strand 24 would serve as an indicator that the bag and the contents thereof had been tampered with or otherwise accessed without authorization.

It is further contemplated herein that mesh fabric 20 may also be formed from a spunbonded fabric, another type of nonwoven fabric, characterized by fine fibers or strands, a relatively random orientation of such strands, and a plurality of crossover points between or among the strands thereof. Accordingly, similar to the above-described embodiments, if mesh fabric 20 were formed from a pigmented spunbonded fabric having a metal (or print or coated) layer disposed over at least one surface thereof, breaking the thermal bond(s), and thus disrupting the metal (or print or coated) layer, at one or more crossover points between or among the strands (by displacing or shifting one or more such strands, or by stretching the fabric to so displace or shift one or more such strands), would expose the pigmented, non-metalized (or unprinted or uncoated) surface(s) of the one or more strands at the corresponding crossover point(s). In addition to the foregoing, mesh fabric 20 may also be formed from other pigmented nonwoven fabrics, including, for example, carded web fabrics and meltblown fabrics.

While the invention has been described with reference to certain exemplary embodiments thereof, those skilled in the art may make various modifications to the described embodiments of the invention without departing from the scope of the invention. The terms and descriptions used herein are set forth by way of illustration only and not meant as limitations. Although the invention has been described and disclosed in various terms and certain embodiments, the scope of the invention is not intended to be, nor should it be deemed to be, limited thereby and such other modifications or embodiments as may be suggested by the teachings herein are particularly reserved, especially as they fall within the breadth and scope of the claims here appended. Those skilled in the art will recognize that these and other variations are possible within the scope of the invention as defined in the following claims and their equivalents.

What is claimed is:

1. A tamper-evident mesh material comprising:
   a nonwoven mesh fabric, said mesh fabric comprising a plurality of strands, said plurality of strands comprising overlying strands and underlying strands, wherein said overlying strands and said underlying strands comprise a pigmentation, and wherein said overlying strands are bonded to said underlying strands at a plurality of crossover points; and, a contrast layer, wherein said contrast layer is visually distinct from said pigmentation of said overlying strands and said underlying strands, and wherein said contrast layer is disposed over at least a portion of each said overlying strand and each said underlying strand, and over said plurality of crossover points, wherein breakage of a bond between at least one of said overlying strands and at least one of said underlying strands at a crossover point of said plurality of crossover points exposes at least one pigmented section of said at least one underlying strand at said crossover point to indicate breakage of said bond.

2. The tamper-evident mesh material of claim 1, wherein said overlying strands are oriented in a first direction and disposed over said underling strands, and wherein said underlying strands are oriented in a second direction.

3. The tamper-evident mesh material of claim 1, wherein said contrast layer is disposed over at least a front surface of each said overlying strand and each said underlying strand to conceal the pigmentation of said front surface of each said overlying strand and each said underlying strand, except for those sections on said front surface of each said underlying strand over which said overlying strands are bonded.

4. The tamper-evident mesh material of claim 1, wherein said contrast layer is a metal layer.

5. The tamper-evident mesh material of claim 4, wherein said metal layer is selected from the group consisting of stainless steel, titanium, aluminum, gold, copper, silver, metal, metal oxide alloys, and combinations thereof.

6. The tamper-evident mesh material of claim 1, wherein said contrast layer is a printed or coated layer.

7. The tamper-evident mesh material of claim 6, wherein said contrast layer is selected from the group consisting of acrylic inks, urethane inks, acrylic coatings, urethane coating, and combinations thereof.

8. A tamper-evident bag comprising:
a first side, a second side, an opening and a bottom;
at least a portion of at least one of said first side, said second side and said bottom formed from a tamper evident mesh material;
said tamper evident mesh material comprising a nonwoven mesh fabric, said mesh fabric comprising a plurality of strands, said plurality of strands comprising overlying strands and underlying strands, wherein said overlying strands and said underlying strands comprise a pigmentation, and wherein said overlying strands are bonded to said underlying strands at a plurality of crossover points; and,
a contrast layer, wherein said contrast layer is visually distinct from said pigmentation of said overlying strands and said underlying strands, and wherein said contrast layer is disposed over at least a portion of each said overlying strand and each said underlying strand, and over said plurality of crossover points,
wherein breakage of a bond between at least one of said overlying strands and at least one of said underlying strands at a crossover point of said plurality of crossover points exposes at least one pigmented section of said at least one underlying strand at said crossover point to indicate breakage of said bond.

9. The tamper-evident bag of claim 8, wherein said overlying strands are oriented in a first direction and disposed over said underling strands, and wherein said underlying strands are oriented in a second direction.

10. The tamper-evident bag of claim 8, wherein said contrast layer is disposed over at least a front surface of each said overlying strand and each said underlying strand to conceal the pigmentation of said front surface of each said overlying strand and each said underlying strand, except for those sections on said front surface of each said underlying strand over which said overlying strands are bonded.

11. The tamper-evident bag of claim 8, wherein said contrast layer is a metal layer.

12. The tamper-evident bag of claim 11, wherein said metal layer is selected from the group consisting of stainless steel, titanium, aluminum, gold, copper, silver, metal, metal oxide alloys, and combinations thereof.

13. The tamper-evident bag of claim 8, wherein said contrast layer is a printed or coated layer.

14. The tamper-evident bag of claim 13, wherein said contrast layer is selected from the group consisting of acrylic inks, urethane inks, acrylic coatings, urethane coating, and combinations thereof.

15. A method of manufacturing a tamper-evident nonwoven mesh material, comprising the steps of:
obtaining a plurality of strands, said plurality of strands comprising overlying strands and underlying strands, wherein said overlying strands and said underlying strands comprise a pigmentation;
bonding said overlying strands to said underlying strands at a plurality of crossover points; and,
applying a contrast layer over at least a portion of each said overlying strand and each said underlying strand, and over said plurality of crossover points, wherein said contrast layer is visually distinct from said pigmentation of said overlying strands and said underlying strands,
wherein breakage of a bond between at least one of said overlying strands and at least one of said underlying strands at a crossover point of said plurality of crossover points exposes at least one pigmented section of said at least one underlying strand at said crossover point to indicate breakage of said bond.

16. The method of claim 15, wherein said overlying strands are oriented in a first direction, and wherein said underlying strands are oriented in a second direction.

17. The method of claim 15, wherein said step of applying a contrast layer comprises the step of applying said contrast layer over at least a front surface of each said overlying strand and each said underlying strand to conceal the pigmentation of said front surface of each said overlying strand and each said underlying strand, except for those sections on said front surface of each said underlying strand over which said overlying strands are bonded.

18. The method of claim 15, wherein said contrast layer is a metal layer.

19. The method of claim 16, wherein said metal layer is selected from the group consisting of stainless steel, titanium, aluminum, gold, copper, silver, metal, metal oxide alloys, and combinations thereof.

20. The method of claim 15, wherein said contrast layer is a printed or coated layer.

21. The method of claim 20, wherein said contrast layer is selected from the group consisting of acrylic inks, urethane inks, acrylic coatings, urethane coating, and combinations thereof.

22. The method of claim 15, wherein said step of applying a contrast layer comprises the step of applying said contrast layer by a vacuum metallization, sputter coating, gravure printing, slit die coating, or foam coating process.

* * * * *